United States Patent [19]

Miyamoto et al.

[11] Patent Number: 5,208,103
[45] Date of Patent: May 4, 1993

[54] COVER TAPE FOR PACKAGING CHIP TYPE ELECTRONIC PARTS

[75] Inventors: Tomoharu Miyamoto, Itami; Shigeru Maeda, Kobe, both of Japan

[73] Assignee: Sumitomo Bakelite Company Limited, Tokyo, Japan

[21] Appl. No.: 785,116

[22] Filed: Oct. 30, 1991

[30] Foreign Application Priority Data

Feb. 28, 1991 [JP] Japan .................. 3-117090

[51] Int. Cl.$^5$ .................. B32B 5/16; B32B 7/12
[52] U.S. Cl. .................. 428/354; 428/323; 428/328; 428/329; 428/349; 428/355; 428/922
[58] Field of Search .............. 428/349, 323, 922, 354, 428/328, 329, 355

[56] References Cited

U.S. PATENT DOCUMENTS

| | | | |
|---|---|---|---|
| 4,156,751 | 5/1979 | Yenni, Jr. et al. | 428/922 X |
| 4,343,855 | 8/1982 | Conder | 428/332 |
| 4,367,312 | 1/1983 | Bontinck et al. | 428/520 X |
| 4,648,508 | 3/1987 | Neal et al. | 428/922 X |
| 4,699,830 | 10/1987 | White | 428/922 X |
| 4,929,486 | 5/1990 | Itou et al. | 428/354 X |
| 4,956,232 | 9/1990 | Balloni et al. | 428/349 |
| 4,963,405 | 10/1990 | Yamashita et al. | 428/354 X |
| 4,999,242 | 3/1991 | Ishiwata et al. | 428/354 X |

FOREIGN PATENT DOCUMENTS

| | | |
|---|---|---|
| 0061238 | 9/1982 | European Pat. Off. |
| 150882 | 1/1985 | European Pat. Off. |
| 0273003 | 6/1988 | European Pat. Off. |
| 0354709 | 2/1990 | European Pat. Off. |
| 0372728 | 6/1990 | European Pat. Off. |
| 182200 | 9/1985 | Japan |
| 24670 | 1/1990 | Japan |
| 2219756 | 12/1989 | United Kingdom |

OTHER PUBLICATIONS

J86-12936 Abst.

Primary Examiner—Jenna L. Davis
Assistant Examiner—D. R. Zirker
Attorney, Agent, or Firm—Browdy and Neimark

[57] ABSTRACT

The present invention provides a cover tape used for packaging of electronic parts in the form of a chip, which comprises an outer layer, an intermediate layer and an adhesion layer and which is heat-sealable to a plastic carrier tape having at given intervals pockets for accommodation of chip type electronic parts, characterized in that the outer layer is a biaxially oriented film, the intermediate layer is a polyolefin film which causes its own cohesive failure to enable peeling, and the adhesion layer consists of a dispersion of conductive fine powders of tin oxide or the like in a thermoplastic resin. In the cover tape, the adhesion layer has been subjected to antistatic treatment using the conductive fine powders, and hence generation of static electricity by the contact of the electronic parts with the cover tape or at the time of cover tape pelling is reduced, and the antistatic effect is stable against the use conditions and the lapse of time and has no influence on the sealing property of the cover tape.

2 Claims, 1 Drawing Sheet

COVER TAPE FOR PACKAGING CHIP TYPE ELECTRONIC PARTS

FIELD OF THE INVENTION

The present invention relates to a cover tape heat-sealable to a plastic carrier tape having at given intervals pockets for accommodation of electronic parts in the form of a ship which cover tape constitutes one component of packaging materials which are used for storage, transportation and mounting of chip type electronic parts and which are capable of arranging and taking out said electronic parts to protect them from contamination and to mount them on an electronic circuit substrate.

BACKGROUND OF THE INVENTION

In recent years, chip type electronic parts used for surface mounting, such as ICs, transistors, diodes, condensers, piezoelectric resistors and the like have been supplied contained in packaging materials consisting of a plastic carrier tape having at given intervals pockets formed by embossing so as to accommodate chip type electronic parts of particular shape and a cover tape heat-sealable to the carrier tape. The electronic parts contained in the packaging materials are automatically taken out after peeling the cover tape of the package, and are mounted on the surface of an electronic circuit substrate.

The strength when the cover tape is peeled off from the carrier tape is called "peel-off strength". When the peel-off strength was too low, there was a problem that the cover tape was separated from the package at the time of the package transfer and the contents, i.e., the electronic parts fell off. When the peel-off strength was too high, there occurred a phenomenon that the carrier tape underwent vibration in peeling the cover tape and, as a result, the electronic parts jumped out of the pockets right before their mounting, i.e., jumping trouble.

As a material for the carrier tape, there have conventionally been used polyvinyl chloride (PVC) sheet, polystyrol sheet, polyester (PET) sheet, polycarbonate sheet, acrylic sheet and other sheets, all of which are readily formed into sheets. Meanwhile, as a cover tape heat-sealable to the carrier tape, there has generally been used a composite film obtained by laminating a polyethylene-modified film or an ethylene-vinyl acetate copolymer (EVA)-modified film which is heat-sealable for a PVC or polystyrol sheet to a biaxially oriented polyester film. In the conventional cover tape, however, the peel-off strength was greatly affected by the sealing conditions such as sealing temperature, sealing pressure and the like, and the fluctuation in sealing conditions made it difficult to control the peel-off strength in an appropriate range as mentioned above; further, the peel-off strength was also affected by temperature and humidity depending upon the storage conditions of the conventional cover tape or the storage conditions after sealing, whereby the peel-off strength was increased or decreased with the lapse of time and, in some cases, deviated from an appropriate range.

There are two types of cover tapes which differ in peeling mechanism; one is an interface peeling type and the other is a cohesion peeling type. In the case of the interface peeling type, it was difficult to satisfy two contradictory properties of "strong adhesion and easy peeling" which are basic requirements for cover tapes, because the sealing surface and the peeling surface are the same; the peel-off strength was affected by the surface condition of a carrier tape to which a cover tape was to be sealed, and consequently fluctuated and thus it was difficult to control the peel-off strength in an appropriate range as mentioned above; the peel-off strength was also affected by temperature and humidity depending upon the storage conditions of a cover tape or the storage conditions after sealing; whereby the peel-off strength was increased or decreased with the lapse of time and, in some cases, deviated from an appropriate range. Meanwhile, in the case of the cohesion peeling type, by using a film as disclosed in Japanese Patent Publication No. 12936/1986, it was possible to produce a cover tape wherein the sealing surface and the peeling surface were different and the peel-off strength was obtained by the cohesive strength of the adhesion layer; this cover tape showed excellent properties which were stable even with the lapse of time. However, the cohesive strength of the adhesion layer was not so large; therefore, when the cover tape as a product was stored in a rolled state particularly at high temperatures in summer, etc., the biaxially oriented film caused blocking with sealing surface at the core portion, which caused insufficient sealing, significant reduction in transparency, etc. Further, regarding "strong adhesion and easy peeling", easy peeling could be attained by cohesion peeling, but strong adhesion still had a problem because the adhesion layer did not strongly adhere to a carrier tape and the adhesion was greatly affected by the sealing surface condition and sealing width of the carrier tape.

With the significant improvement in surface mounting technique in recent years, electronic parts to be surface-mounted have come to be made in chips of higher capability and smaller size. In such a movement, the electronic parts, when transferred in a package, have undergone vibration and contact with the embossed inner surface of the carrier tape of the package or the inner surface of the cover tape of the package, and the resulting friction has generated static electricity; static electricity has been also generated when the cover tape was peeled off from the carrier tape; this static electricity has generated sparks to cause destruction and deterioration of the electronic parts. Thus, the electronic parts have had troubles due to static electricity, and it has been the most important task to develop an antistatic measure for packaging materials such as carrier tape and cover tape.

The antistatic treatment for a carrier tape has hitherto been effected by incorporation or coating of carbon black into or on the carrier tape material used, and the effect has been satisfactory. However, no sufficient measure has yet been taken for the antistatic treatment for a cover tape, and currently there is merely effected, for example, coating of an antistatic agent or a conductive material on the outer layer of the cover tape. This treatment, however, has not been sufficient for the protection of electronic parts to be contained by sealing, because the treatment is applied to the outer side of the cover tape, and the treatment was ineffective particularly for the static electricity generated by the contact of the inner surface of the cover tape with the electronic parts. The antistatic treatment for the inner surface of the cover tape, i.e. the adhesion layer of the cover tape can be effected by coating or incorporation of an antistatic agent on or into the adhesion layer. In the case of incorporation, however, the antistatic agent incorporated into the adhesion layer has bled onto the inner surface of the cover tape and invited unstable sealing and many troubles due to poor sealing; moreover, the antistatic effect has decreased with the lapse of time, has been greatly affected by the conditions under which the package was used, i.e., temperature and humidity, particularly humidity, and has significantly decreased under a low humidity such as 10% R.H.; thus, no sufficient effect has been obtained. Meanwhile, the incorporation of a conductive material into an adhesion layer has been technically difficult, because the adhesion layer has been formed by laminating an extruded film or the like to an outer layer; moreover, the incorporation has significantly reduced the transparency of the resulting cover tape, making the cover tape usability questionable. The coating of a conductive material on an adhesion layer has not been effected in fact, because the selection of a binder stably bondable to the carrier tape has been difficult, and because the adhesion layer is covered and hidden by the coating.

SUMMARY OF THE INVENTION

The present inventors carried out extensive study in order to solve the above-mentioned problems and obtain a cover tape whose adhesion layer has been subjected to an antistatic treatment, whose peel-off strength is only slightly affected by the sealing conditions and shows small change with the lapse of time, and whose sealing property is stable. As a result, the present inventors found that a composite film comprising (a) an outer layer consisting of a biaxially oriented film, (b) an intermediate layer provided between said outer layer and an adhesion layer to be described later, consisting of a polyolefin film which causes its own cohesive failure to enable peeling when said composite film which has been used as a cover tape sealed to a carrier tape is peeled, and (c) an adhesion layer coated on said intermediate layer, consisting of a thermoplastic adhesive of heat seal lacquer type in which conductive fine powders have been dispersed, is transparent and can be used as a cover tape having good properties. The above finding has led to the completion of the present invention.

The present invention resides in a cover tape used for packaging of chip type electronic parts, which comprises an outer layer, an intermediate layer and an adhesion layer and which is heat-sealable to a plastic carrier tape having at given intervals pockets for accommodation of chip type electronic parts, characterized in that the outer layer is a biaxially oriented film consisting of polyester, polypropylene or nylon, the intermediate layer provided between the outer layer and the adhesion layer is a polyolefin film which comprises (a) 55–95% by weight of at least one ethylene polymer selected from polyethylenes having a density of 0.91–0.93 g/cm$^3$ and ethylene-vinyl acetate copolymers containing 10% by weight or less of vinyl acetate, (b) 5–30% by weight of a polystyrene and (c) 0–20% by weight of a styrene-butadiene-styrene or styrene-isoprene-styrene block copolymer having thermoplastic elastomeric properties, and which causes its own cohesive failure to enable peeling when the cover tape which has been sealed to a carrier tape is peeled, and the adhesion layer consists of a dispersion of conductive fine powders consisting of tin oxide, zinc oxide, titanium oxide, carbon black or a Si-based organic compound, or a combination thereof, dispersed in a thermoplastic resin consisting of polyurethane resin, acrylic resin, polyvinyl chloride resin, ethylene-vinyl acetate copolymer resin or polyester resin, or a combination thereof. The preferred embodiment of the present invention is a cover tape for packaging of chip type electronic parts, characterized in that the amount of the conductive fine powders added is 10–1,000 parts by weight per 100 parts by weight of the thermoplastic resin of the adhesion layer, that the adhesion strength between the adhesion layer of the cover tape and the sealing surface of the carrier tape is larger than the cohesive strength of the intermediate layer of the cover tape, that the cohesive strength of the intermediate layer of the cover tape is 10–120 g per mm of sealing width, and that the visible light transmittance of the cover tape is 10% or more.

Figure 1:
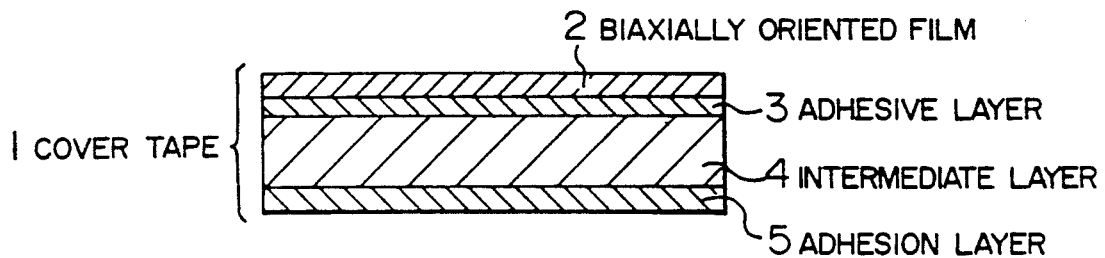
FIG. 1 is a sectional view showing an example of the layer constitution of a cover tape of the present invention.

The constitutional elements of the cover tape 1 of the present invention are explained with reference to FIG. 1. The outer layer 2 is a biaxially oriented film consisting of biaxially oriented polyester film, biaxially oriented polypropylene film or biaxially oriented nylon film, and has a thickness of 6–100 μm, transparency and high rigidity. When the thickness is less than 6 μm, the rigidity is lost. When the thickness exceeds 100 μm, the hardness is too high, making the sealing unstable. The surface of the outer layer 2 contacting with the adhesive layer 3 can be, if necessary, subjected to a surface treatment such as corona treatment, plasma treatment, sandblasting treatment or the like to increase the adhesion strength to the adhesive layer 3. The exterior surface of the outer layer 2 may be coated with a surfactant, conductive powders or the like in order to impart an antistatic property to said surface.

The intermediate layer 4 is a polyolefin film which comprises (a) 55–95% by weight of at least one ethylene polymer selected from polyethylenes having a density of 0.91–0.93 g/cm$^3$ and ethylene-vinyl acetate copolymers containing 10% by weight or less of vinyl acetate, (b) 5–30% by weight of a polystyrene and (c) 0–20% by weight of a styrene-butadiene-styrene or styrene-isoprene-styrene block copolymer having thermoplastic elastomeric properties and which causes its own cohesive failure to enable peeling when the cover tape which has been sealed to a carrier tape is peeled. The surface of the intermediate layer 4 contacting with the adhesion layer 5 may be, if necessary, subjected to a surface treatment such as corona treatment, plasma treatment, sandblasting treatment or the like to increase the adhesion between the intermediate layer 4 and the adhesion layer 5.

The adhesion layer 5 consists of a transparent thermoplastic resin of heat-sealing lacquer type (e.g., polyurethane resin, acrylic resin, ethylene-vinyl acetate copolymer resin, polyvinyl chloride resin, polyester resin), and there is selected one single resin or a mixed resin each of which is heat-sealable to a plastic carrier tape 6 to which the adhesion layer 5 is to be bonded. Owing to the presence of this heat-sealing adhesion layer which covers the intermediate layer wherein cohesion peeling takes place, the blocking of the intermediate to the biaxially oriented film can be prevented, when the cover tape is stored at high temperatures and, at the same time, the adhesion of the cover tape to the carrier tape is improved.

In the adhesion layer there are uniformly dispersed conductive fine powders consisting of tin oxide, zinc oxide, titanium oxide, carbon black or a Si-based organic compound. The surface resistivity of the adhesion layer after film formation is required to be $10^{13}$ $\Omega/\square$ or less and is preferably in a range of $10^6$–$10^9$ $\Omega/\square$. When the surface resistivity is larger than $10^{13}$ $\Omega/\square$, the antistatic effect is extremely poor and no desired property can be obtained. The amount of the conductive fine powders added is 10–1,000 parts by weight, preferably 100–400 parts by weight per 100 parts by weight of the thermoplastic resin of the adhesion layer, in view of the above surface resistance requirement. When the amount is less than 10 parts by weight, no antistatic effect is exhibited. When the amount is more than 1,000 parts by weight, the dispersibility of the conductive fine powders in the thermoplastic resin of the adhesion layer is remarkably poor, the resulting adhesion layer is significantly low in adhesion to the intermediate layer 4 and transparency, and the production cost is high, resulting in poor productivity. The antistatic material has conductivity by itself and accordingly has antistatic effect semipermanently, and does not cause bleeding, etc. and therefore does not adversely affect the sealing property of the adhesion layer; the surface resistivity of the adhesion layer is controlled at a level of $10^{13}$ $\Omega/\square$ or less and hence, in the package comprising the carrier tape 6 containing electronic parts and the cover tape 1 sealed to the carrier tape 6, no static electricity is generated by the contact of the electronic parts with the cover tape 1 during the transportation of the package, or at the time of peeling of the cover tape 1 for pick-up of the electronic parts, whereby the electronic parts can be prevented from troubles due to static electricity.

In order to enhance the antistatic effect, an antistatic layer or a conductive layer may be provided on the both surfaces of the outer layer, i.e., the biaxially oriented film The method for forming a heat-sealable adhesion layer can be a film formation method using a melt or a film formation method using a solution, but the film formation method using a solution is preferable in view of the dispersibility of the conductive fine powders. The film thickness of the adhesion layer is preferably 5 μm or less, more preferably 2 μm or less. When the film thickness is larger than 5 μm it is difficult to form an adhesion layer by the method using a solution, in view of the procedures adopted by the method.

In order to improve the lamination strength between the outer layer and the intermediate layer, it is possible to laminate these two layers via an adhesive layer of lacquer type, said layer being formed by drying, solidifying and curing an isocyanate type, an imine type or the like.

Figure 2:
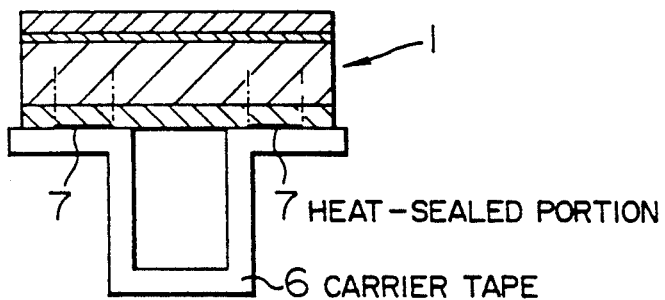
FIG. 2 is a sectional view showing a state where a cover tape of the present invention has been bonded to a carrier tape.
Figure 3:
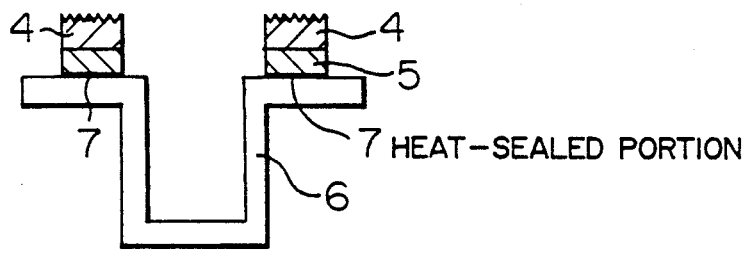
FIG. 3 is a sectional view showing a state of a carrier tape where a cover tape of the present invention has been bonded to the carrier tape and then peeled therefrom.
Figure 4:
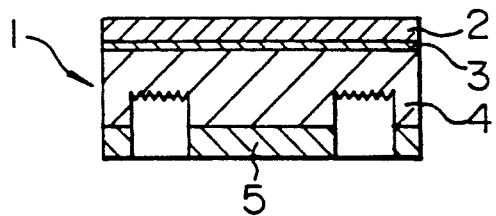
FIG. 4 is a sectional view showing a state of a cover tape of the present invention where the cover tape has been bonded to a carrier tape and then peeled therefrom.

In the seal-peel process of the cover tape, first the cover tape 1 is continuously sealed to the both sides of the carrier tape 6 in a two-rail shape with the one side sealing width of about 1 mm (FIG. 2); then, the cover tape 1 is peeled off from the carrier tape 6. In this peeling, when the adhesion strength between the adhesion layer 5 of the cover tape 1 and the sealing surface of the carrier tape 6 is smaller than the cohesive strength of the intermediate layer 4, the peel-off strength corresponds to the adhesion strength between the adhesion layer 5 of the cover tape 1 and the sealing surface of the carrier tape 6, and peeling occurs in the form of interfacial peeling which is the most common peeling mechanism currently adopted. In this case, strong sealing of the cover tape to the carrier tape makes peeling difficult, and weak sealing incurs spontaneous peeling; thus, it has been unable to satisfy both of two contradictory properties essentially required for the cover tape, i.e., high sealability to the carrier tape and easy peelability at the time of peeling. Meanwhile, when, as in the present invention, the adhesion strength between the adhesion layer 5 of the cover tape 1 and the sealing surface of the carrier tape 6 is larger than the cohesive strength of the intermediate layer 4 of the cover tape 1 only the sealed portion 7 of the adhesion layer 5 and the intermediate layer 4 remains on the carrier tape (FIG. 3) and, in the cover tape after peeling (FIG. 4), only the heat-sealed portion 7 of the adhesion layer 5 and the intermediate layer 4 is lost by cohesion peeling caused by cohesive failure. That is, the peel-off strength corresponds to the cohesive strength of the intermediate layer 4; and it is possible to design the layers so that the sealing/peeling surface can be completely separated, the sealing of the cover tape 1 to the carrier tape 6 can be effected strongly, and the peeling of the cover tape 1 can be effected very easily. In short, the peeling surfaces are designed in the cover tape 1, and the cohesive strength of the intermediate layer can be designed freely irrelevantly to the material of the carrier tape 6. The sealing surface of the cover tape 1 can be strongly sealed to the carrier tape 6 by the selection of an adhesive, whereby a stable seal-peel mechanism can be obtained.

In this case, a polyolefin film is selected so that the cohesive strength of the intermediate layer 4 of the cover tape 1 becomes 10–120 g, preferably 10–70 g per mm of sealing width. When the peeling strength is smaller than 10 g, there occurs a problem during the transportation of the package that the cover tape is spontaneously removed and the electronic parts contained in the package fall off. When the peeling strength is larger than 120 g, there occurs a phenomenon that the carrier tape undergoes vibration at the time of cover tape peeling and the electronic parts jump out of the pockets of the carrier tape right before the mounting of the electronic parts, i.e., jumping trouble. According to the cohesion peeling mechanism of the present invention, as compared with the conventional interfacial peeling, there can be obtained a cover tape having the intended property, i.e , peel-off strength which is only slightly affected by sealing conditions and which shows small change with the lapse of time when stored under various conditions.

The present cover tape is constituted so as to have a visible light transmittance of 10% or more, preferably 50% or more, making it possible to identify the electronic parts contained in the carrier tape by sealing, visually or using an instrument. When the transmittance is lower than 10%, the identification of the electronic parts is difficult.

DETAILED DESCRIPTION OF THE INVENTION

Examples of the present invention and Comparative Examples are shown hereinafter. However, the present invention is in no way restricted by these Examples.

EXAMPLES 1, 2, 3, 4 AND 5 AND COMPARATIVE EXAMPLES 1, 2, 3, 4 AND 5

On the polyolefin film side of a laminate of a biaxially oriented film to become an outer layer and a polyolefin film to become an intermediate layer, there was coated an ethyl acetate solution containing a mixture of a thermoplastic resin and conductive fine powders, using a gravure coater; and the coating was made into a film of 2 μm in thickness to form an adhesion layer; thus, various cover tapes composed of layers as shown in Tables 1 and 2 were obtained. Each of the cover tapes was slitted to a width of 5.5 mm and then heat-sealed to a PVC carrier tape of 8 mm in width, after which measurement of peeling strength was effected. There were also effected measurements of surface resistance at the adhesion layer side and visible light transmittance of each of the experimental cover tapes. The evaluation results of these properties are shown in Tables 3 and 4.

EXAMPLES 6, 7, 8, 9 AND 10

The procedures of Example 1 were repeated except that the amount of conductive fine powders $SnO_2$ added in the adhesion layer was changed as follows.

|  | Amount of $SnO_2$ per 100 parts by weight of PVC type resin |
|---|---|
| Example 6 | 20 parts by weight |
| Example 7 | 50 parts by weight |
| Example 8 | 500 parts by weight |
| Example 9 | 750 parts by weight |
| Example 10 | 900 parts by weight |

Properties of the resulting samples were evaluated similarly to Example 1. The results thereof are shown in Table 5.

TABLE 1

|  | Example 1 | Example 2 | Example 3 | Example 4 | Example 5 |
|---|---|---|---|---|---|
| Outer layer | Biaxially oriented PET | Biaxially oriented NY | Biaxially oriented PP | Biaxially oriented PET | Biaxially oriented NY |
| Intermediate layer | | | | | |
| Density (g/cm$^3$) | 0.923 | 0.915 | 0.927 | 0.925 | 0.912 |
| Polyethylene | 65 | 80 | 90 | 70 | 55 |
| Polystyrene | 20 | 12 | 7 | 20 | 30 |
| Styrene-butadiene-styrene | 15 | 8 | 3 | | |
| Styrene-isoprene-styrene | | | | 10 | 15 |
| Adhesion layer | | | | | |
| Thermoplastic resin | PVC type | EVA type | PET type | Acrylic type | Polyurethane type |
| Conductive fine powders | $SnO_2$ 150 | $TiO_2$ 250 | $ZnO_2$ 100 | Carbon black 350 | Ethyl silicate 120 |

Notes
PET: Polyethylene terephthalate, PP: Polypropylene, NY: Nylon, EVA: Ethylene-vinyl acetate copolymer, PVC: Polyvinyl chloride, $SnO_2$: Tin oxide, $TiO_2$: Titanium oxide, $ZnO_2$: Zinc oxide
Layer thickness: Outer layer = 12 μm, Intermediate layer = 50 μm, Adhesion layer = 2 μm
The figure of each component of the intermediate layer refers to parts by weight of the component per 100 parts by weight of the total of the three components.
The figure of conductive fine powders refers to parts by weight of said powders added to 100 parts by weight of the thermoplastic resin of the adhesion layer.

TABLE 2

|  | Comparative Example 1 | Comparative Example 2 | Comparative Example 3 | Comparative Example 4 | Comparative Example 5 |
|---|---|---|---|---|---|
| Outer layer | Biaxially oriented PET | Biaxially oriented NY | Biaxially oriented PET | Biaxially oriented PP | Biaxially oriented PET |
| Intermediate layer | | | | | |
| Density (g/cm$^3$) | 0.925 | 0.975 | | | 0.915 |
| Polyethylene | 40 | 75 | | | 70 |
| Polystyrene | 35 | 15 | | | 20 |
| Styrene-butadiene-styrene | | 10 | | | |
| Styrene-isoprene-styrene | 25 | | | | 10 |
| Adhesion layer | | | | | |
| Thermoplastic resin | PVC type | Acrylic type | PET type | EVA type | |
| Conductive fine powders | $SnO_2$ 1100 | $ZnO_2$ 6 | Surfactant 1 | | |

Notes
PET: Polyethylene terephthalate, PP: Polypropylene, NY: Nylon, EVA: Ethylene-vinyl acetate copolymer, PVC: Polyvinyl chloride, $SnO_2$: Tin oxide, $TiO_2$: Titanium oxide, $ZnO_2$: Zinc oxide
Layer thickness: Outer layer = 12 μm, Intermediate layer = 50 μm, Adhesion layer = 2 μm
The figure of each component of the intermediate layer refers to parts by weight of the component per 100 parts by weight of the total of the three components.
The figure of conductive fine powders refers to parts by weight of said powders added to 100 parts by weight of the thermoplastic resin of the adhesion layer.

TABLE 3

|  | Example 1 | Example 2 | Example 3 | Example 4 | Example 5 |
| --- | --- | --- | --- | --- | --- |
| Peeling Strength | | | | | |
| Initial Value | 55 | 50 | 40 | 54 | 60 |
| 40° C.-90%, 30 days | 56 | 45 | 30 | 50 | 50 |
| 60° C., 30 days | | | | | |
| Roll exterior | 60 | 53 | 42 | 60 | 65 |
| Roll core | 58 | 52 | 45 | 62 | 60 |
| Blocking | No | No | No | No | No |
| Total light transmittance (%) (roll core) | 82.0 | 72.2 | 85.2 | 69.5 | 81.5 |
| Mechanism of peeling | Cohesion peeling | Cohesion peeling | Cohesion peeling | Cohesion peeling | Cohesion peeling |
| Surface resistance of adhesion layer ($\Omega/\square$) | $10^7$ | $10^6$ | $10^9$ | $10^9$ | $10^8$ |
| Total light transmittance (%) | 85.0 | 71.5 | 85.2 | 69.7 | 81.2 |

Notes
Heat-sealing conditions: 140° C., 1 kg/cm$^2$, 1 sec, sealing width = 1 mm × 2 places
Peeling conditions: 180° peeling, peeling speed = 300 mm/min
Number of samples: 3

TABLE 4

|  | Comparative Example 1 | Comparative Example 2 | Comparative Example 3 | Comparative Example 4 | Comparative Example 5 |
| --- | --- | --- | --- | --- | --- |
| Peeling strength | | | | | |
| Initial value | 40 | 50 | 30 | 80 | 55 |
| 40° C.-90%, 30 days | 25 | 52 | 15 | 13 | 54 |
| 60° C., 30 days | | | | | |
| Roll exterior | 45 | 58 | Tape tearing | 175 | 58 |
| Roll core | 46 | 56 | Tape tearing | 168 | 13 |
| Blocking | No | No | No | Yes | Yes |
| Total light transmittance (%) (roll core) | 25.0 | 85.0 | 86.4 | 78.0 | 40.8 |
| Mechanism of peeling | Cohesion peeling | Cohesion peeling | Interfacial peeling | Interfacial peeling | Cohesion peeling |
| Surface resistance of adhesion layer ($\Omega/\square$) | $10^6$ | $10^{14}$ | $10^{13}$ | $10^{15}$ | $10^{15}$ |
| Total light transmittance (%) | 27.3 | 85.3 | 86.6 | 83.5 | 84.3 |

Notes
Heat-sealing conditions: 140° C., 1 kg/cm$^2$, 1 sec. sealing width = 1 mm × 2 places
Peeling conditions: 180° peeling, peeling speed = 300 mm/min
Number of samples: 3

TABLE 5

|  | Example 6 | Example 7 | Example 8 | Example 9 | Example 10 |
| --- | --- | --- | --- | --- | --- |
| Peeling strength | | | | | |
| Initial value | 53 | 55 | 53 | 50 | 48 |
| 40° C.-90%, 30 days | 55 | 55 | 49 | 47 | 45 |
| 60° C., 30 days | | | | | |
| Roll exterior | 56 | 59 | 57 | 53 | 48 |
| Roll core | 55 | 57 | 57 | 50 | 47 |
| Blocking | No | No | No | No | No |
| Total light transmittance (%) (roll core) | 84.5 | 84.2 | 75.3 | 70.0 | 65.2 |
| Mechanism of peeling | Cohesion peeling | Cohesion peeling | Cohesion peeling | Cohesion peeling | Cohesion peeling |
| Surface resistance of adhesion layer ($\Omega/\square$) | $10^9$ | $10^9$ | $10^7$ | $10^6$ | $10^6$ |
| Total light transmittance (%) | 85.5 | 85.2 | 77.1 | 70.5 | 65.5 |

Notes
Heat-sealing conditions: 140° C., 1 kg/cm$^2$, 1 sec. sealing width = 1 mm × 2 places
Peeling conditions: 180° peeling, peeling speed = 300 mm/min
Number of samples: 3

As apparent from the foregoing Examples and Comparative Examples, owing to the following three features, i.e., a feature that the adhesion layer has been subjected to an antistatic treatment, and hence generation of static electricity by the contact of the electronic parts with the cover tape or at the time of cover tape peeling is reduced, and the antistatic effect is stable against the use conditions or the lapse of time and has no influence on the sealing property of the cover tape, a feature that the peel-off strength can be set at a desired level in a range of 10-120 g per mm by the combination of the cohesive strength of the intermediate layer and the adhesion strength of the adhesion layer to the carrier tape, and a feature that the peel-off strength is determined by the cohesive strength of the intermediate layer within the cover tape and accordingly is not affected by the sealing conditions between the adhesion layer and the carrier tape, the cover tape of the present invention can solve the problems of conventional cover tapes, i.e., a problem that the peel-off strength is greatly affected by the sealing conditions, a problem that the peel-off strength changes with the lapse of time depending upon the storage conditions, and a problem that static electricity is generated by the contact of the electronic parts with the cover tape or at the time of cover tape peeling, and thereby it is possible to obtain a stable peel-off strength.

What is claimed is:

1. A cover tape used for packaging of electronic parts in the form of a chip comprising:

an outer layer;

a laminating adhesive layer;

an intermediate layer; and an adhesion layer which is heat-sealable to a plastic carrier tape having at given intervals pockets for accommodation of electronic parts in the form of a chip;

wherein the outer layer is made of a biaxially oriented film made from a polymer selected from the group consisting of polyester, polypropylene, and nylon and the visible light transmittance of the cover tape is at least 65.4% and the thickness of the outer layer is from 6 to 100 microns;

the adhesive layer is between the outer layer and the intermediate layer;

the intermediate layer is a polyolefin film comprising (a) 55–95% by weight of at least one ethylene polymer selected from the group consisting of polyethylene having a density of 0.91–0.93 g/cm$^3$ and ethylene-vinyl acetate copolymers containing 10% by weight or less of vinyl acetate; (b) 5–30% by weight of polystyrene and (c) 0–20% by weight of a thermoplastic elastomeric polymer selected from the group consisting of styrene-butadiene-styrene and styrene-isoprene-styrene, and having cohesive strength of 10–120 g per mm of sealing width and wherein the adhesion strength between the adhesion layer and the sealing surface of the carrier tape is larger than the cohesive strength of the intermediate layer of the cover tape; and the adhesion layer comprises a thermoplastic resin in which is dispersed from 10–10,000 parts by weight per 100 parts by weight of the thermoplastic resin a conductive fine powder, said conductive fine powder being selected from the group consisting of tin oxide, zinc oxide, titanium oxide, ethyl silicate, carbon black, and mixtures thereof, the thickness of the adhesion layer is 5 microns or less, and the surface resistivity of the adhesion layer is $10^{13}$ ohms per square or less.

2. The cover tape according to claim 1 wherein the thermoplastic resin of the adhesion layer is selected from the group consisting of polyurethane resin, acrylic resin, polyvinyl chloride resin, ethylene-vinyl acetate copolymer resin, polyester resin, and mixtures thereof.

* * * * *